United States Patent [19]
Adams et al.

[11] Patent Number: 5,991,323
[45] Date of Patent: Nov. 23, 1999

[54] LASER TRANSMITTER FOR REDUCED SIGNAL DISTORTION

[75] Inventors: Laura Ellen Adams, Basking Ridge; Clyde George Bethea, Franklin, both of N.J.; Gerald Nykolak, Long Beach, N.Y.; Roosevelt People, Plainfield; Tawee Tanbun-Ek, Califon, both of N.J.

[73] Assignee: Lucent Technologies Inc., Murray Hill, N.J.

[21] Appl. No.: 08/954,022

[22] Filed: Oct. 20, 1997

[51] Int. Cl.$^6$ .............................. H01S 3/19; H01S 3/00; H01S 3/10; H01S 3/08
[52] U.S. Cl. .............................. 372/50; 372/38; 372/20; 372/26; 372/96
[58] Field of Search .............................. 372/50, 96, 38, 372/20, 26, 27, 102; 359/180–181, 183, 249, 187–188; 385/1

[56] References Cited

U.S. PATENT DOCUMENTS

| | | | |
|---|---|---|---|
| 5,184,243 | 2/1993 | Henmi et al. | 359/381 |
| 5,303,079 | 4/1994 | Gnauck et al. | 359/188 |
| 5,606,573 | 2/1997 | Tsang | 372/96 |
| 5,699,179 | 12/1997 | Gopalakrishnan | 359/183 |

FOREIGN PATENT DOCUMENTS

| | | | |
|---|---|---|---|
| 671791 | 9/1995 | European Pat. Off. | H01S 3/025 |
| 762577A1 | 3/1997 | European Pat. Off. | H01S 3/103 |
| 057286 | 3/1991 | Japan | H01S 3/18 |
| 5-183512 | 7/1993 | Japan . | |

OTHER PUBLICATIONS

T. Tanbun-Ek et al., Broad-Band Tunable Electroabsorption . . . , IEEE J. Selected Topics in Quantum Electr., vol. 3, pp. 960–966 (Jun. 1997).

Y-K. Park et al., Dispersion–Penalty–Free Transmission . . . , IEEE Photonics Tech. Lett., vol. 8, No. 9, pp. 1255–1257 (Sep. 1996).

K. C. Reichmann et al., 2.5 Gb/s Transmission . . . , IEEE Photonics Tech. Lett., vol. 5, No. 9, pp. 1098–1100 (Sep. 1993).

T. Numai, 1.5–$\mu$m Wavelength Tunable Phase–shift Controlled Distributed Feedback Laser, J. Lightwave Tech., vol. 10, No. 2, pp. 199–205 (Feb. 1992).

W. T. Tsang et al., Control of Lasing Wavelength in Distributed Feedback Lasers by Angling the Active Stripe with Respect to the Grating, IEEE Photonics Tech. Lett., vol. 5, No. 9, pp. 978–980 (Sep. 1993).

H. Nakajima et al., Absorption–controlled tunable DFB amplifier–filters, Electronics Lett., vol. 30, No. 16, pp. 1294–1296 (Aug. 4, 1994).

H. Hillmer et al., Tailored DFB Laser Properties by Individually Chirped Gratings Using Bent Waveguides, IEEE J. Selected Topics in Quantum Electronics, vol. 1, No. 2, pp.356–362 (Jun. 1995).

H. Nakajima et al., Very high speed wavelength switching capability Franz–Keldysh electroabsorption DFB lasers, OFC '96 Technical Digest, p. 276 (1996) No month Available.

L. E. Adams et al., System Performance of High–Speed Broadband–Tunable Laser for Wavelength Conversion in WDM Networks, OFC '97, Postdeadline Paper No. PD11, pp. 1–4 (Feb. 1997).

(List continued on next page.)

*Primary Examiner*—Rodney Bovernick
*Assistant Examiner*—Quyen Phan Leung
*Attorney, Agent, or Firm*—Eugene E. Pacher

[57] ABSTRACT

A tunable semiconductor laser comprises a gain section having an MQW active region, a uniform pitch grating DFB region, and first waveguide. A composite reflector, including a second MQW region and a second waveguide, forms a cavity resonator with the DFB region. A tuning voltage applied to the composite reflector induces a quantum confined stark effect, thereby allowing the center wavelength to be altered. A pre-chirp signal applied the composite reflector reduces signal distortion in fiber optic systems.

12 Claims, 2 Drawing Sheets

OTHER PUBLICATIONS

T. Tanbun–Ek et al., Tunable Electroabsorption Modulated Laser Integrated with a Bent Waveguide Distributed–Feedback Laser, IEEE Photonics Tech. Lett., vol. 9, No. 5, pp. 563–565(May 1997).

Y. K. Park et al., Dispersion–Penalty–Free Transmission . . . , IEEE Photonics Technology Letters, vol. 8, No. 9, pp. 1255–1257 (Sep. 1996).

K. Morito et al. Penalty–Free 10 Gb/sNRZ Transmission . . . , IEEE Photonics Technology Letters, vol. 8, No. 3, pp. 431–433 (Mar. 1996).

Y. Kodama et al., Theory of NRZ transmission control, OFC' 96 Technical Digest, Paper TuI6, pp. 48–49 (1996) (No Month Available).

D. A. Fishman, Design and Performance of Externally Modulated 1.5 –um Laser Transmitter . . . , Journal of Lightwave Technology, vol. 11, No. 4, pp. 624–632 (Apr. 1993).

G. P. Agrawal, Nonlinear Fiber Optics, Sections 2.3 and 2.4, pp. 34–50, Academic Press, Inc.(1989) No Month Available.

LASER TRANSMITTER FOR REDUCED SIGNAL DISTORTION

CROSS-REFERENCE TO RELATED APPLICATIONS

This application was concurrently filed with application Ser. No. 08/954,305, entitled *Broadband Tunable Semiconductor Laser Source* (Adams 1-16-1-6-5-2-11-57), with application Ser. No. 08/954,575, entitled *Sub-Carrier Multiplexing in Broadband Optical Networks* (Adams 2-17-7-6-12), and with application Ser. No. 08/954,576 entitled *Laser Transmitter for Reduced SBS* (Adams 4-19-7-9-8-14).

FIELD OF THE INVENTION

This invention relates generally to laser transmitters and, more particularly, to broadband, tunable, semiconductor laser transmitters which reduce signal distortion in fiber optic systems.

BACKGROUND OF THE INVENTION

In 1992 D. A. Fishman suggested that future fiber-optic transmission systems would likely take advantage of fiber amplifiers to increase the distance and capacity of unrepeatered fiber spans, and that they would employ externally modulated, narrow linewidth, tunable CW lasers capable of transmitting signals over long unrepeatered spans even in the presence of large levels of chromatic dispersion. He further indicated that technological advances would be focused on increasing span lengths and capacity by reducing dispersion penalties, improving the optical amplifiers, and addressing limitations due to fiber nonlinearities. See, *Journal of Lightwave Technology*, Vol. 11, No. 4, pp. 624–632 (1993), which is incorporated herein by reference.

Indeed, fiber nonlinearity and dispersion continue to impose limitations on the performance of fiber-optic transmission systems, particularly high bit rate digital systems. They introduce signal distortion which in turn produces intersymbol interference and reduces the maximum transmitted power, the signal-to-noise ratio, and the unrepeatered span length.

Theoretical analysis by Y. Kodama et al. has indicated that by properly pre-chirping (or pre-distorting) a non-return-to-zero (NRZ) digital signal certain nonlinearities of the fiber (e.g., self phase modulation) and the dispersion of the fiber (a linear effect) may both be canceled. The appropriate pre-distortion depends on the input power level, the type of fiber, and the average dispersion of the fiber link in question. See, *OFC'96 Technical Digest*, Paper Tul6, pp.48–49 (1996), which is incorporated herein by reference. However, Kodama et al. provided no actual transmitter design to verify their theory, and as a consequence disclosed no actual pre-chirp waveform which would accomplish the reduction in signal distortion. Others in the art have endeavored to address the linear (positive) dispersion problem by, for example, introducing negative wavelength chirp via a suitable bias voltage applied to an external electroabsorption (EA) modulator integrated with a DFB laser. The EA modulator in these designs served a dual function: to introduce into the transmitted signal both negative wavelength chirp and amplitude modulation. See, for example K. Morito et al., *IEEE Photonics Technology Letters*, Vol. 8, No. 3, pp. 431–433 (1996) and Y. K. Park et al., *IEEE Photonics Letters*, Vol. 8, No. 9, pp. 1255–1257 (1996), both of which are incorporated herein by reference. These devices are reported to have a chirped NRZ output signal in which the leading edge of the pulses was red-shifted (i.e., slightly increased in wavelength) whereas the trailing edge of the pulses was blue-shifted (i.e., slightly decreased in wavelength). Transmission at 10 Gb/s over 100 km and 130 km standard fiber without dispersion penalty was also reported. However, neither Morito et al. nor Park et al. address the problem of fiber nonlinearities. Moreover, the dual function EA modulator is disadvantageous because the pre-chirping and data encoding processes cannot both be optimized unless each function can be controlled independently. For example, the modulation waveform parameters (e.g., amplitude, voltage-offset and shape) for the highest extinction ratio encoding will typically not be optimized for pre-chirp dispersion compensation.

However, we believe further improvement in transmission, addressing both fiber nonlinearities and dispersion, is realizable if an arbitrary, tailored (e.g., optimized) pre-chirp waveform can be made to pre-distort the output signal of the laser transmitter.

SUMMARY OF THE INVENTION

In a WDM fiber-optic transmission system, a digital laser transmitter comprises a broadband, tunable semiconductor laser which includes an intracavity, integrated composite reflector to which a tuning voltage and a pre-chirp signal are applied. The tuning voltage provides coarse wavelength tuning among WDM channels, whereas the pre-chirp signal reduces signal distortion produced by fiber nonlinearities and dispersion. To this end, the waveform of the pre-chirp signal is tailored as a function of input power level to the fiber, the type of fiber, and the average dispersion of the fiber. In addition, the frequency of the pre-chirp signal is of the same order as the bit rate of the laser output signal; that is, the pre-chirp wavelength deviations are controlled on the timescale of a bit period (i.e., bit duration) of the output signal of the transmitter.

In a preferred embodiment, the tunable laser provides an optical output signal in any one of N different longitudinal modes at wavelengths corresponding, for example, to the N channels of the WDM system. The laser comprises an MQW active region, a DFB region for selecting the nominal wavelength of stimulated emission (i.e., laser light) generated by the active region, and a first waveguide optically coupled to the active region to permit egress of the laser output signal. The tunable laser is characterized in that a composite second reflector is coupled to one end of the first waveguide so as to form a cavity resonator with the DFB region. The second reflector includes an MQW second region optically coupled to the MQW active region, a second waveguide having one end optically coupled to the first waveguide, and a high reflectivity dielectric layer disposed at the other end of the second waveguide. In order to tune the center wavelength of the laser light, the tuning voltage is applied to the MQW second region to induce changes in refractive index through the Quantum Confined Stark Effect (QCSE). In order to reduce signal distortion, the pre-chirp signal is also applied to the MQW second region.

BRIEF DESCRIPTION OF THE DRAWINGS

Our invention, together with its various features and advantages, can be readily understood from the following more detailed description taken in conjunction with the accompanying drawing, in which.

Figure 1:
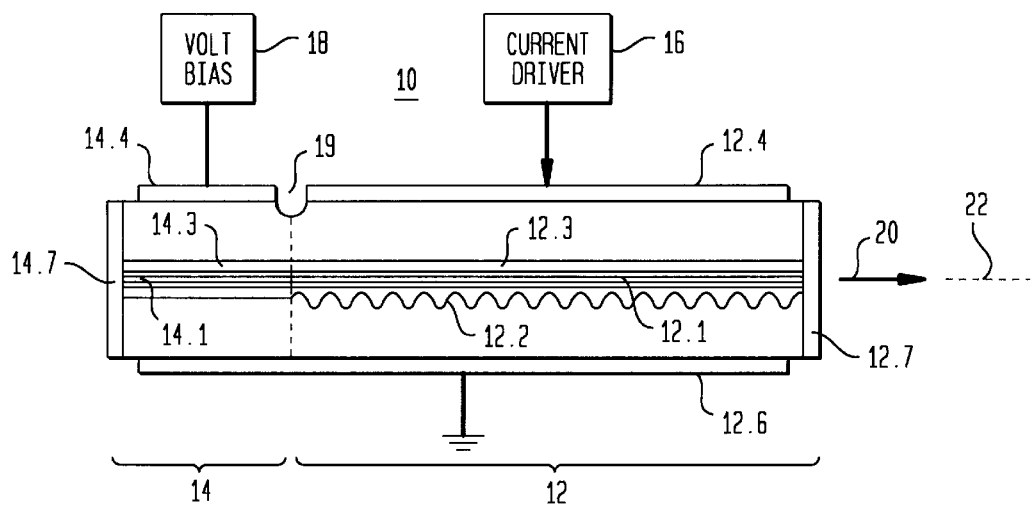
FIG. 1 is a schematic cross-sectional view of a tunable semiconductor laser in accordance with one embodiment of our invention.
Figure 2:
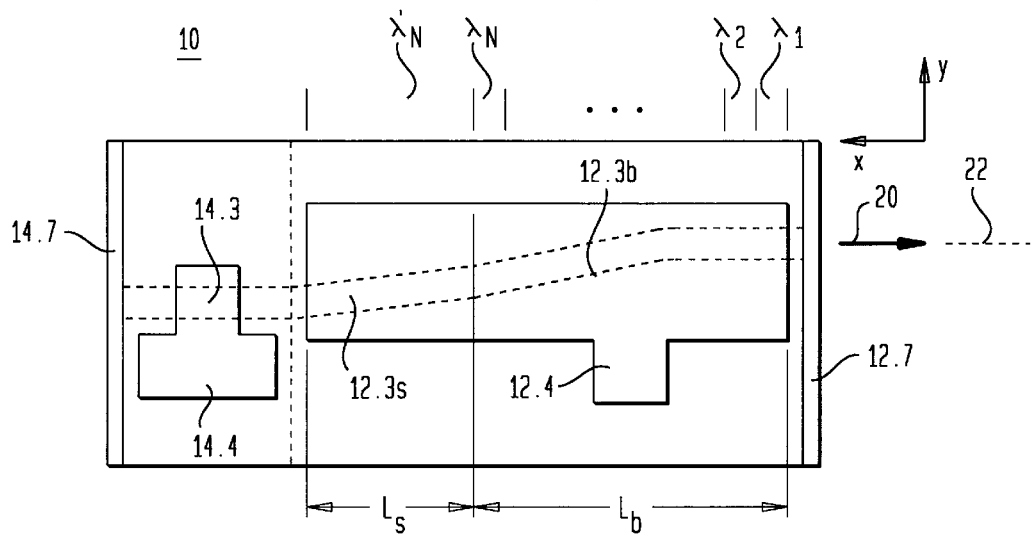
FIG. 2 is a schematic top view of the laser of FIG. 1.
Figure 3:
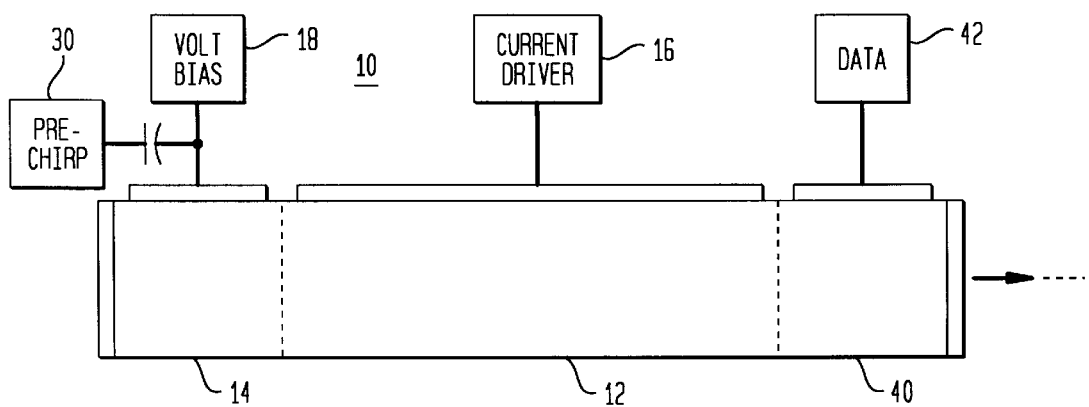
FIG. 3 is a schematic view of the laser of FIG. 1 in which a pre-chirp signal source 30 is coupled to the composite reflector section 14 in order to reduce signal distortion.

In the interests of simplicity and clarity, FIGS. 1–3 have not been drawn to scale.

DETAILED DESCRIPTION OF THE INVENTION

Reduction of Signal Distortion

With reference now to FIG. 3, a broadband, tunable semiconductor laser 10 comprises a gain section 12 and an intracavity, integrated composite reflector section 14 arranged in tandem with one another. A current driver 16 supplies current to the gain section in order to generate an output signal 20. As described more fully hereinafter, a DC voltage supplied to reflector section 14 by bias source 18 coarsely tunes the center wavelength of the output signal by controlling the phase of the optical field within the laser cavity. In addition, the output signal is typically coupled to a transmission medium (not shown; e.g., a silica optical fiber) in which the signal tends to be distorted by nonlinearities (e.g. self phase modulation) and by dispersion. In order to reduce signal distortion in accordance with one aspect of our invention, a relatively high frequency, low voltage pre-chirp voltage signal is also supplied to reflector section 14 in order to produce relatively small wavelength excursions (i.e., variations) around the center wavelength. In general, the waveform of the pre-chirp signal is a function of the input power delivered by the transmitter to the fiber, the type of fiber (e.g., core-cladding geometry, dopants, doping profile, etc.), and the average dispersion of the fiber. The actual waveform in any particular system application is calculated using Schroedinger's nonlinear equations which describe how optical pulses propagate in a nonlinear dispersive medium such as a silica optical fiber. See, for example, G. V. Agrawal, *Nonlinear Fiber Optics,* Academic Press, Inc., Boston, Section 2.3, pp. 34–44 (1989), which is incorporated herein by reference. In addition, the frequency of the pre-chirp signal should be of the same order as the bit rate of the output signal in digital applications; that is, the wavelength deviations are controlled on the timescale of a bit period (i.e., bit duration)

Pre-chirp Signal Waveform

Figure 4:
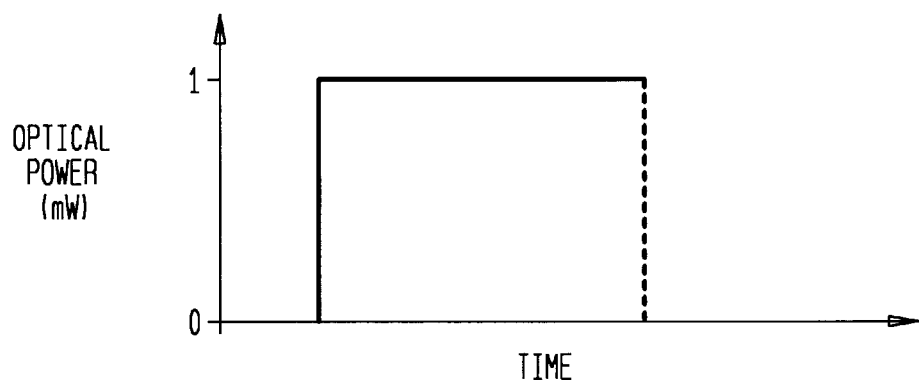
FIGS. 4–6 illustrate a hypothetical chirp profile (FIG. 5) produced by a corresponding voltage waveform (FIG. 6) for dispersion compensation of a an optical NRZ pulse (FIG. 4) propagating in a dispersive fiber optic system.
Figure 5:
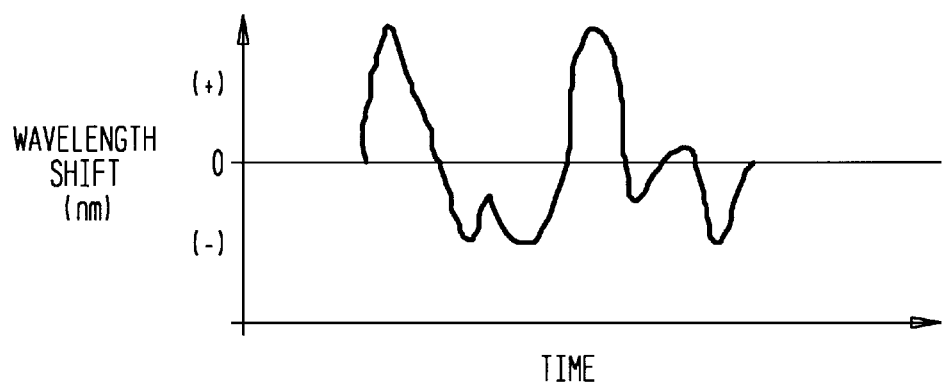
Figure 6:
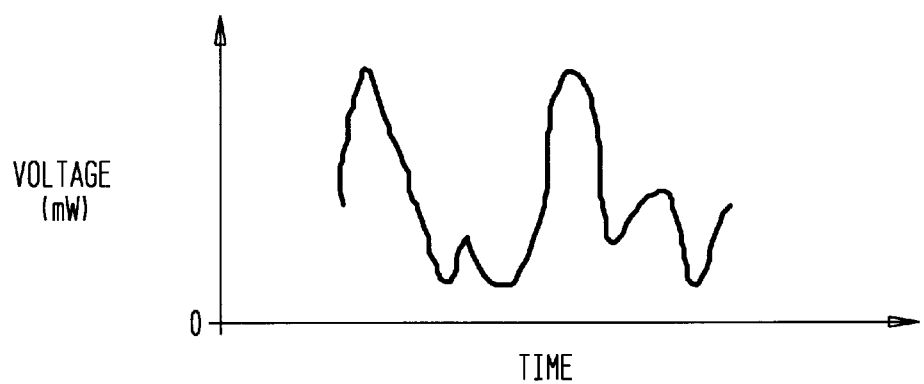

FIGS. 4–6 show in greater detail how dispersion compensation is achieved in accordance with one embodiment of our invention. The particular operating conditions, device parameters and system specifications are provided by way of illustration only and unless expressly stated otherwise are not intended to limit the scope of the invention.

FIG. 4 illustrates a typical optical NRZ pulse of 1 mW intensity for propagation in a fiber optic digital system characterized by signal distortion. The pulse duration $\tau$ is assumed to be 1 ns corresponding to a 1 Gb/s data rate. For the given launch power of 1 mW and a center wavelength of $\lambda_i$ of operation, the resultant average path dispersion and nonlinearity can be calculated for the system. Using well-known numerical simulation techniques (also taught by Agrawal, supra, Section 2.4 and incorporated herein by reference), Schroedinger's equations can be solved for the given initial conditions. In addition, the solution to these equations will also determine the desired chirp profile for the laser output which will reduce the transmitted signal distortion. FIG. 5 shows a hypothetical chirp profile which would be determined using this approach. This figure shows the time-resolved wavelength variations (e.g., ±0.1 nm) during a pulse interval (i.e., 1 bit period). Our high speed, tunable laser transmitter 10 (FIGS. 1–3) enables these rapid wavelength variations to be impressed on the output signal of the transmitter. More specifically, a suitable voltage waveform (FIG. 6), having essentially the same profile as the calculated chirp profile (FIG. 5), is applied to the composite reflector section 14 of the transmitter 10 in order to phase modulate the intracavity laser radiation (via the QCSE) and produce the desired variations in its center wavelength. As discussed in Example II, infra, our laser transmitter is capable of high speed wavelength shifting on a 50 ps timescale, more than adequate for the chirp profile of FIG. 5 which only requires controlled wavelength variations on a timescale shorter than the 1 ns (1000 ps) pulse duration of the NRZ pulse of FIG. 4. Of course, the 50 ps wavelength-shifting speed of the transmitter would accommodate dispersion compensation in even higher bit rate systems (e.g. up to nearly 20 Gb/s systems).

Broadband Tuning

Turning now to FIGS. 1 and 2, we describe in greater detail the structure and operation of the broadband, tunable laser source 10 of FIG. 3. The source 10 generates an optical output signal 20 in any one of a plurality of N longitudinal modes each having a different wavelength $\lambda_i$ (i=1, 2, ... N). The output signal 20 propagates along a transmission axis 22 of, for example, a WDM system (not shown). The systems contemplated may embrace low speed applications (e.g., infrequent network reconfigurations) as well as relatively high speed applications (e.g., optical packet switches). In any case, the tunable source 10 comprises a cavity resonator formed by a gain section 12 and a composite reflector section 14.

The gain section 12 includes a relatively wide effective bandgap MQW active region 12.1, a DFB region 12.2 comprising a uniform pitch grating optically coupled to the active region, and a relatively narrower bandgap first waveguide 12.3 optically coupled to the active region. The output of the waveguide 12.3 is coupled to transmission axis 22 through a relatively low reflectivity dielectric layer (or composite of layers; e.g., an AR coating) 12.7. When current driver 16 supplies above-threshold forward bias current to the active region via electrodes 12.4 and 12.6, the laser source 10 generates light (radiation) at a wavelength determined by the composition and gain spectrum of the MQW region. In the absence of tuning mechanisms, the pitch of the DFB grating determines which longitudinal mode within the gain spectrum is selected. This mode is coupled into the first waveguide 12.3 and provides the laser output 20. As discussed later, any one of a plurality of N longitudinal modes at different wavelengths can be selected by modifying the laser design in accordance with various aspects of our invention.

In one aspect, the laser source 10 is provided with the composite reflector section 14 which, as indicated above, forms a cavity resonator with the gain section 12 (i.e., with the DFB region 12.2). More specifically, section 14 includes an MQW second region 14.1 optically coupled to the MQW active region 12.1, a second waveguide 14.3 having one end optically coupled to the first waveguide 12.3, and a relatively high reflectivity dielectric layer (or composite of layers; e.g., an HR coating) 14.7 disposed at the other end of the second waveguide 14.3.

In a second aspect shown in FIG. 2, the laser source 10 is provided with a first waveguide 12.3 having a predetermined shape (e.g., a raised-sine shape) which effectively segments the portion 12.3b of the waveguide 12.3 (i.e., the portion under electrode 12.4) into N zones corresponding to the N different wavelengths of WDM system (i.e., the channel wavelengths). These zones, labeled $\lambda_i$ (i 1, 2 ... N) in FIG. 2, each provide optical feedback at a different wavelength because the waveguide 12.3b has a different slope (i.e., relative to the grating lines) within each zone. However, continuous tuning over the range $\lambda_1$ to $\lambda_N$ is possible only if all of the longitudinal modes corresponding to these wavelengths have essentially the same threshold gains. This desideratum is achieved by a combination of the shape of the waveguide 12.3b (which determines the flatness of the gain spectrum of the modes) and the drive current (which determines the gain of the MQW active region 12.1). In addition, modes corresponding to zones in which the waveguide slope is larger experience higher loss. To compensate for the higher loss in the longest wavelength zone $\lambda_N$, which has the highest waveguide slope, the waveguide 12.3 is provided with a straight (i.e., linear) portion 12.3s disposed between the shaped portion 12.3b and the second waveguide 14.3 of the composite reflector section 14. Since the electrode 12.4 overlaps the portion 12.3s, the Nth mode is provided with additional gain to offset the higher losses (i.e., the zone for the Nth mode includes not only the region labeled $\lambda_N$ under electrode 12.3b in FIG. 2, but also the region labeled $\lambda_N$ under electrode 12.3s).

The shape y(x) of the waveguide portions 12.3b and 12.3s and their corresponding grating pitch functions A(x) can be described by a set of equations as follows. In the range $L_s \leq x \leq L_B$ the shape of the waveguide 12.3b follows essentially a raised-sine shape given by $$y_b = W + (W/L_b)(2L_s - x) + (W/\pi)\sin(\pi x/L_b) \quad (1)$$

where x is distance along the direction of light propagation (e.g., along transmission axis 22), W is the maximum displacement of y(x) from axis 22 in the case where the straight portion 12.3s is omitted, $L_s$ is the length of the straight waveguide portion 12.3s, and $L_b$ is the length of the shaped waveguide portion 12.3b. The corresponding grating pitch is given by $$\Lambda_b = \Lambda_0[1 + (W/L_b)^2(\cos\pi x/L_b - 1)^2]^{1/2} \quad (2)$$

where $\Lambda_0$ is the pitch of the uniform grating of the DFB region 12.2. In contrast, in the range $L_b \leq x \leq (L_b + L_s)$ the shape of the waveguide 12.3s follows a straight line function given by $$y_s = 2W + (2W/L_b)(L_s - x) \quad (3)$$

whereas the grating pitch is given by $$\Lambda_s = \Lambda_0[1 + (2W/L_b)^2]^{1/2} \quad (4)$$

Although the combination of a raised-sine function and a straight line function for the two waveguide segments is preferred, other functions can be utilized depending on the particular application contemplated.

In a third aspect of our invention, the laser source 10 is provided with means for applying an electrical control signal to the composite reflector section 14 which effectively alters the phase of light propagating in the second waveguide 14.3 and hence in the laser source as a whole. Illustratively, an electrical signal from source 18 is applied to section 14 via electrodes 14.4 and 12.6. The signal may take on several forms (i.e., current or voltage), but is preferably a reverse bias voltage which induces the Quantum Confined Stark Effect (QCSE) in the MQW second region 14.3. The QCSE, in turn, induces changes in the refractive index of the MQW region 14.3 and hence in the phase of the light propagating in the second waveguide 14.3. Therefore, by varying the applied voltage the laser source 10 can be tuned over a relatively broad range of wavelengths corresponding the wavelengths spanned by the N zones of the first waveguide 12.3. In general, varying only a single parameter, such as the control voltage level applied to the composite reflector section 14 enables the wavelength of the laser source to be tuned over a moderately broad range (e.g., about 2 nm) at relatively high speeds (e.g., 50–100 ps). However, varying several parameters, such as the control voltage level, the drive current and the temperature of the laser, enables tuning over a much broader wavelength range (e.g., 10–12 nm), albeit at more modest speeds (e.g., in the millisecond to nanosecond range).

The following examples demonstrate the efficacy of our invention for both relatively low speed and relatively high speed applications. The various materials, dimensions, operating conditions and other parameters are provided by way of illustration only, and are not to be construed as limitations on the scope of the invention unless expressly so indicated.

EXAMPLE I: Low Speed Tuning

A laser source 10 was fabricated using selective area growth MOVPE to grow the various semiconductor layers and standard processing to etch shapes, deposit electrodes and the like. The MQW regions 12.3 and 14.3 comprised 7 layers of strained InGaAsP (1.55 μm bandgap) interleaved with barrier layers of InGaAsP (1.28 μm bandgap). Transverse mode control was accomplished by forming a 1 μm wide well-known CMBH structure. InP:Fe current blocking layers 3 μm thick were formed on either side of the CMBH structure in order to reduce leakage current and parasitic capacitance. A shallow groove 19 about 80 μm long was used to enhance electrical isolation with a typical resistance of 25 kΩ. The waveguides 12.3b and 12.3s had shapes defined essentially by equations (1) and (3) above and were designed to provide gain in eight longitudinal modes corresponding to eight channels (each about 1.4 nm wide) of a WDM system at wavelengths ranging from 1549.4 to 1560.7 nm.

We were able to tune the laser source through all eight channels (over more than an 11 nm range) by appropriate choice of bias voltage, drive current and temperature. The typical power delivered into a single mode fiber was 10 mW at a drive current of 60 mA. The mean side mode suppression ratio was about 36 dB. The following table illustrates how the three parameters were varied to achieve tuning over a relatively broad 11 nm range.

| CHANNEL NO. | WAVE-LENGTH (nm) | TEMPERA-TURE (° C.) | BIAS VOLTAGE (V) | DRIVE CURRENT (mA) |
|---|---|---|---|---|
| 1 | 1549.42 | 25 | −1.80 | 60 |
| 2 | 1551.02 | 25 | 0.00 | 60 |
| 3 | 1552.63 | 25 | 0.00 | 70 |
| 4 | 1554.25 | 25 | 1.10 | 170 |
| 5 | 1555.86 | 25 | 1.73 | 320 |
| 6 | 1557.47 | 35 | 1.67 | 300 |

-continued

| CHANNEL NO. | WAVE-LENGTH (nm) | TEMPERA-TURE (° C.) | BIAS VOLTAGE (V) | DRIVE CURRENT (mA) |
|---|---|---|---|---|
| 7 | 1559.09 | 45 | 2.30 | 290 |
| 8 | 1560.72 | 50 | 2.40 | 290 |

This low speed tuning range of 11 nm is more than double the best result reported in the prior art (Cf. H. Hillmer et al., *IEEE J. Selected Topics in Quantum Electronics,* Vol. 1, No. 2, pp. 356–362 (1995); incorporated herein by reference).

EXAMPLE II: High Speed Tuning

A laser source similar to the one described in Example I was utilized to demonstrate single parameter, high speed tuning over a relatively broad wavelength range. The single parameter varied was the bias voltage applied to the composite reflector section 14. When driven with a bias voltage having a 350 ps period, the laser output tuned back and forth between high (1551.7 nm) and low (1550.0 nm) wavelengths at the same rate. The output switched from short to long wavelength over a 1.7 nm range in 56 ps and switched back in 134 ps (10% to 90% rise time). The side mode suppression ratio was about 35 dB during tuning. This high speed tuning range is nearly an order of magnitude better than that previously reported by the prior art (Cf., H. Nakajima et al, *OFC Technical Digest,* p. 276 (1996); incorporated herein by reference). High speed switching between four channels (channel spacing 0.7 nm) was also demonstrated using a 4-level bias voltage. The ability of our tunable laser source to address multiple WDM channels and to switch between them at very high speeds should enable optical routing on a cell-by-cell basis in a WDM network without requiring large guard times.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. For example, in long distance transmission systems a narrow linewidth laser source is particularly important because fiber dispersion tends to increase pulse width. But, spatial hole burning in the laser, which can be caused by non-uniform current drive, tends to increase linewidth. Therefore, it is particularly advantageous that the drive current be applied substantially uniformly to the MQW active region 12.1. To this end, it is preferable that the electrode 12.4 be a single, non-segmented electrode and, likewise, that the active region 12.1 be a single, non-segmented region. By employing these features in our invention we were able to obtain linewidths of 1–2 MHz, which we expect would be an order of magnitude improvement compared to prior art segmented designs (Cf., Hillmer et al. and Nakajima et al., supra).

In addition, the output of the tunable laser may be modulated. Thus, as shown in FIG. 3, we have fabricated an integrated optical circuit including an external (i.e., extracavity) modulator 40, in particular an electroabsorption modulator, and a tunable laser of the type previously described. Data from source 42 was imposed on the laser output in the form of AM (i.e., on-off keying). In this fashion, the multiple functions of distortion reduction, data modulation and wavelength tuning among WDM channels may be realized with a single integrated device.

What is claimed is:

1. A laser transmitter comprising
   a tunable laser source for delivering to an optical fiber a digital optical output signal in any one of N different longitudinal modes, said source including
      a gain section including an MQW active region, a DFB region optically coupled to said active region for selecting the nominal wavelength of the longitudinal mode which lases, and a first waveguide optically coupled to said active region to permit egress of the laser output signal,
      a composite reflector optically coupled to one end of said first waveguide so as to form a cavity resonator with said DFB region, said composite reflector including an MQW second region optically coupled to said MQW active region, a second waveguide having one end optically coupled to said first waveguide, and a relatively high reflectivity dielectric layer disposed at the other end of said second waveguide,
      tuner means for applying a tuning voltage to said MQW second region to induce therein a quantum confined stark effect, thereby to alter the center wavelength of said output signal, and driver means for applying drive current to said active region,
      the current applied to said active region and the shape of said first waveguide being mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes, and
   a pre-chirp source for applying to said MQW second region a pre-chirp voltage signal effective to reduce signal distortion in said output signal.

2. The invention of claim 1 wherein the waveform of said a pre-chirp signal is a function of the input power delivered by said transmitter to said fiber, the type of fiber, and the average dispersion of said fiber, and the frequency of said pre-chirp signal is of the order of the bit rate of said output signal.

3. The invention of claim 2 wherein said pre-chirp signal induces changes in said center wavelength which are on the timescale of a bit period of said output signal.

4. The invention of claim 1 further including a modulator for impressing digital information on said output signal.

5. The invention of claim 4 wherein said modulator comprises an electroabsorption modulator integrated with said laser.

6. The invention of claim 1 wherein said first portion has a raised-sine function of the form defined by equation (1).

7. The invention of claim 1 wherein said active region is a single, non-segmented region and further including a single, non-segmented electrode for applying said drive current thereto in a substantially uniform manner.

8. A WDM optical system comprising
   an optical fiber which tends to generate distortion in a laser signal coupled thereto,
   a tunable laser source coupled to said fiber for providing an optical output signal in any one of N different longitudinal modes corresponding to N channels of said WDM system, said source including
      a gain section comprising a single, non-segmented InGaAsP MQW active region, a DFB region optically coupled to said active region, said DFB region including a grating of uniform pitch for selecting the nominal wavelength of the longitudinal mode which lases, a first InGaAsP waveguide optically coupled to said active region, and a relatively low reflectivity first dielectric reflector coupled to one end of said first waveguide to permit egress of said laser output signal, a composite reflector optically coupled to the other end of said first waveguide so as to form a cavity resonator with said DFB region, said composite reflector including an InGaAsP MQW second region optically coupled to said MQW active region, a second InGaAsP waveguide having one end optically coupled to said first waveguide, and a relatively high reflectivity second dielectric reflector optically coupled to the other end of said second waveguide, said first waveguide including a first portion and a second portion optically coupling said first portion to said composite reflector, the shape of said first portion corresponding essentially to the raised-sine function of equation (1) and the shape of said second portion corresponding essentially to the straight line function of equation (3), and tuner means for applying voltage to said MQW second region to induce therein a quantum confined stark effect, thereby to alter the center wavelength of said output signal, and driver means for applying drive current to at least those sections of said active region optically coupled to said first waveguide, said driver means comprising a single, non-segmented electrode for applying current to said active region in a substantially uniform manner, wherein said current applied to said active region and the shape of said first waveguide are mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes and a different one said N channels, an electroabsorption modulator integrated with said laser for imposing digital information on said output signal, and a pre-chirp source for applying to said MQW second region a pre-chirp signal effective to reduce distortion of said output signal in said fiber, the waveform of said a pre-chirp signal being a function of the input power delivered by said transmitter to said fiber, the type of fiber, and the average dispersion of said fiber, and the frequency of said pre-chirp signal being of the order of the bit rate of said output signal so that said pre-chirp signal induces changes in said center wavelength which are on the timescale of a bit period of said output signal.

9. The invention of claim 8 wherein said N channels span a wavelength range from about 1549 nm to 1561 nm and said laser source is continuously tunable over said range.

10. An optical system comprising an optical fiber which tends to generate distortion in a laser signal coupled thereto, an integrated optical circuit for generating a modulated, tunable laser output signal coupled to said fiber, said circuit including, arranged in tandem, a tunable semiconductor laser source for generating said output signal and a semiconductor modulator for impressing digital information on said output signal, said laser source including a cavity resonator formed by a DFB gain section for generating said laser signal at a given center wavelength and a composite reflector for altering the phase of the laser signal within said resonator, a tuning source for applying a tuning voltage to said composite reflector to alter said phase and hence the center wavelength of said output signal, and a pre-chirp source for applying to said composite reflector a pre-chirp signal for reducing said distortion.

11. The invention of claim 10 wherein the waveform of said a pre-chirp signal is a function of the input power delivered by said laser to said fiber, the type of fiber, and the average dispersion of said fiber, and the frequency of said pre-chirp signal is of the order of the bit rate of said output signal.

12. The invention of claim 11 wherein said pre-chirp signal induces changes in said center wavelength which are on the timescale of a bit period of said output signal.

* * * * *